United States Patent
Foster et al.

[11] Patent Number: 6,165,682
[45] Date of Patent: Dec. 26, 2000

[54] RADIATION SENSITIVE COPOLYMERS, PHOTORESIST COMPOSITIONS THEREOF AND DEEP UV BILAYER SYSTEMS THEREOF

[75] Inventors: Patrick Foster; John Joseph Biafore; Gregory Domenic Spaziano, all of Providence, R.I.

[73] Assignee: Arch Specialty Chemicals, Inc., Norwalk, Conn.

[21] Appl. No.: 09/401,110

[22] Filed: Sep. 22, 1999

[51] Int. Cl.[7] .................................................. G03F 7/004
[52] U.S. Cl. .................................. 430/270.1; 430/271.1; 430/325; 526/271; 526/279
[58] Field of Search .............................. 430/270.1, 271.1, 430/325; 526/271, 279

[56] References Cited

U.S. PATENT DOCUMENTS

| | | | |
|---|---|---|---|
| 5,360,693 | 11/1994 | Sebald et al. | 430/192 |
| 5,843,624 | 12/1998 | Houlihan et al. | 430/296 |
| 6,042,989 | 3/2000 | Schaedeli et al. | 430/270.1 |
| 6,063,543 | 5/2000 | Hien et al. | 430/270.1 |

FOREIGN PATENT DOCUMENTS 9942903  8/1999  WIPO.

OTHER PUBLICATIONS

"Thermal Stability of Silicon Containing Methacrylatge Based Bilayer Resist for 193 nm Lithography", White, D. et al, Proc.SPIE–Int., 1998, 3333, 132–143.

"Dual–Wavelength Photoresist for Sub–200 nm Lithography", Hein et al. SPIE, vol. 3333, pp. 154–164. Jun. 1998.

*Primary Examiner*—Janet Baxter
*Assistant Examiner*—Rosemary Ashton
*Attorney, Agent, or Firm*—Ohlandt, Greeley, Ruggiero & Perle, L.L.P.

[57] ABSTRACT

Radiation sensitive resins for use in a top layer resists in bilayer systems for use in deep UV photolithography comprises copolymers having the following structural units:

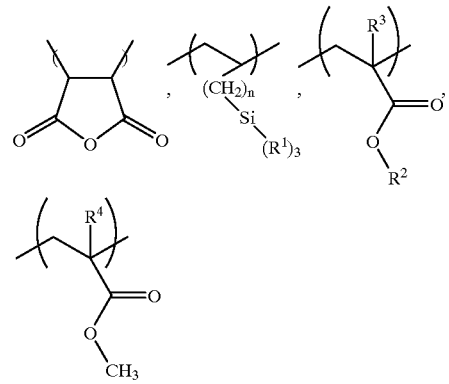

and optionally,

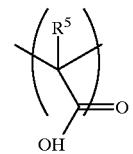

(III)

wherein n is an integer of 1 to 5, $R^1$ is methyl or trimethylsiloxy, $R^2$ is a tert-butyl group, $R^3$, $R^4$ and $R^5$ are each independently hydrogen or a methyl group.

24 Claims, No Drawings

RADIATION SENSITIVE COPOLYMERS, PHOTORESIST COMPOSITIONS THEREOF AND DEEP UV BILAYER SYSTEMS THEREOF

FIELD OF THE INVENTION

This invention relates to new radiation sensitive copolymers for use as a top layer resist in a bilayer system for use in deep UV photolithography, particularly for 248 and 193 nm photolithography, and especially for 193 nm photolithography. The invention also relates to radiation sensitive photoresist compositions comprising the new copolymers and to a process for the lithographic imaging treatment of a substrate by means of the photoresist composition, as will a process for the production of electronic components using the new copolymers in a radiation sensitive photoresist top layer coating in a 248 or 193 nm lithographic system.

BACKGROUND OF THE INVENTION

In recent years, the extent of integration of semiconductor components has been continually increasing. The resolution capacity that can be obtained with conventional deep-UV microlithography has thus appeared to reach its limits. Normally, it is not generally possible to produce, on a substrate, conventional structures with dimensions of less than 0.25 µm, as is required for the production of particularly highly integrated electronics components. These components generally have minimal dimensions down to approximately 0.12 µm. In order to be able to resolve sufficiently, in an optical manner, such fine structural elements, particularly short-wave radiation must be utilized, which generally has a wavelength between 190 and 260 nm.

However, present conventional G-line, I-line and deep-UV (DUV) photoresistant materials are poorly suited for radiation of such wavelength. These conventional materials are usually based on phenolic resins as binders, for example, on novolak resins or on chemically amplified polyhydroxystyrene derivatives with acid labile groups, which show a strong absorption at wavelengths below 260 nm. This leads to the fact that, with the use of such radiation, the side walls of the finished developed resist structures do not form the targeted right angle, but rather form a more or less oblique angle with the substrate or the resist surface, which nullifies the obtaining of optical resolution as a consequence of the use of shortwave radiation.

Photoresists without a sufficiently high proportion of aromatic components, e.g., resists based on methacrylate resins, have proven sufficiently transparent for radiation below 260 nm, but they do not have the plasma etch resistance that is customary for resists based on aromatic resins; plasma etching being one principal method for producing microstructures on silicon substrates. The plasma etch resistance, as is known, is essentially based on the aromatic groups in these resists.

ArF excimer base (193 nm) lithography is a prime candidate for sub 0.18 µm lithography. The leading resist technology approaches for practical 193 nm lithography are top surface imaging (TSI) bilayer resists and single layer. Each approach has its own characteristic advantages and disadvantages as the result of the underlying technology and the materials, which can be utilized. The numerous problems for the 193 nm photoresist chemists to solve, (e.g., transparency, photospeed, adhesion, sensitivity, various process time delay latitudes, and plasma etch resistance), are somewhat different for each technology due to the materials requirements.

Lithographic aspect ratios and other issues require that resist films be thinner (about 0.5 µm) for sub 0.18 µm devices. This, in turn, requires either greatly improved etch processes or improved etch resistance or both. Thus, having excellent plasma etch resistance is critical and it is preferable that it be even better than before because of the thinner films. This presents a materials problem to the resist chemist because now both the aromatic character and the alkali-solubilizing group must be replaced. Thus, new materials, or groups of materials, with high transparency, etch resistance, and a different alkali-solubilizing group are required.

Single layer resists based on alicyclic polymers, for example, based on cyclic hydrocarbons such as norborene, have been found to be transparent enough at 193 nm and to have reasonable plasma etch resistance. However, the alicyclic resins in their "pure state" suffer from high hydrophobicity and adhesion problems. Modifications to improve these and other properties tend to decrease the plasma etch resistance significantly below that of novolac based resins and offer little hope of improved etch resistance.

There have been various solutions proposed for this problem. One solution is offered by the use of a special multilayer technique, generally referred to as bilayer resists. First, an initial resin coating, commonly called an undercoat layer, which is not photoimageable, is introduced onto the substrate. This undercoat layer provides the plasma etch resistance when etching the substrate. A second covering coating layer that can be photoimaged, which contains an organosilicon component instead of a component with a high content of aromatic compounds, is introduced onto the first planarizing layer. The substrate coated in this way is selectively exposed, i.e., in an image-forming way, in the conventional manner and then treated with a suitable developer, so that a desired image-forming structure is generated in the covering coating that can be photostructured. A subsequently conducted treatment in oxygen plasma leads to the organosilicon compounds being oxidized to silicon oxides, at least on the surface, and these oxides form a closed etching barrier or protective surface over the unexposed areas, for the oxidative decomposition of the organic material that lies underneath, particularly the planarizing layer, while the planarizing layer is removed completely in an oxidative manner on those places that are not coated by the silicon-containing covering layer.

Such bilayer resists generally offer improved depth of focus, resolution, substrate compatibility, and aspect ratios.

While various polymers have been proposed for use in such photoimageable top layer compositions in a bilayer system for photolithography at 193 nm wavelength radiation there is still a need for improved polymers with improved lithographic properties for this purpose, and especially for a bilayer system to provide high resolution deep UV lithography, particularly at 193 nm radiation.

BRIEF SUMMARY OF THE INVENTION

The present invention provides novel copolymers and blends thereof suitable for forming top layer photoimageable coatings in a deep UV, particularly a 193 nm, bilayer resist system providing high-resolution photolithography. The present invention also provides new photoresist compositions for forming photoimageable coatings on a substrate for use in 193 nm photolithography. The invention also provides copolymers with chemically amplified (acid labile) moieties and organosilicon moieties suitable for use in the binder resin for photoimageable etching resistant photoresist compositions suitable for use in 248 and 193 nm photolithographic processes.

The novel copolymers (I) of this invention have the following structural units:

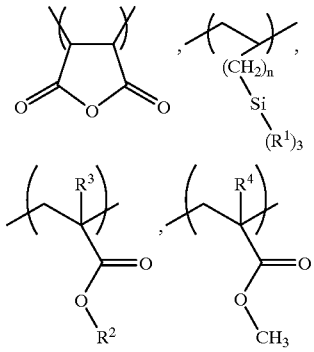

wherein n is an integer of 1 to 5, $R^1$ is a methyl or trimethylsiloxy group; $R^2$ is a tert-butyl group; and $R^3$ and $R^4$ are each independently selected from hydrogen or a methyl group. Preferably n is equal to 1.

The novel copolymers (I) of this invention are prepared by reacting maleic anhydride, an alkenetrimethylsilane or alkene(tristrimethoxysiloxy) silane, t-butyl acrylate or methacrylate and methyl acrylate or methacrylate in a free radical polymerization reaction to form the novel copolymers.

Copolymer (I) generally comprises about 25 to about 50 mole % maleic anhydride units, about 25 to about 50 mole % alkenetrimethylsilane or alkene(tris trimethylsiloxy) silane units, about 1 to about 40 mole % t-butyl methacrylate or acrylate, and about 1 to about 25 mole % methyl acrylate or methacrylate units. The preferred molecular weight (Mw) of copolymer (I) is about 10,000 to about 40,000, preferably from about 15,000 to about 25,000.

The level of silicon in copolymers (I) of this invention will generally be at a level of from about 6 to about 14% by weight, preferably from about 8 to about 12% by weight which is sufficient to allow adequate pattern transfer into the undercoat of the bilayer resist system.

Copolymers (I) of this invention are formulated in suitable solvents with photoacid generating (PAG) compounds which generate acid upon exposure to radiation to provide photosensitive photoresist compositions useful in deep UV, particularly 193 nm, photolithography.

A bilayer coated substrate for use in deep UV photolithography is produced by applying a suitable undercoat or planarizing layer to the substrate and then applying onto the undercoated substrate a photoimageable top layer of the photoresist composition of the copolymer (I) described in the previous paragraph. The new copolymers (I) of this invention provide photoresist compositions suitable for use at 193 and 248 nm wavelength that produce an excellent combination of adhesion, resolution and plasma etch resistance.

Although copolymers (I) can be utilized alone to provide photoresist compositions useful as a photoimageable top coat in a deep UV bilayer photolithography system and provide an excellent combination of adhesion, resolution and plasma etch resistance, it has been discovered that photoresist compositions with a wide variety of minimum rates of dissolution ($R_{min}$) in tetramethyl ammonium hydroxide (TMAH) developer can be provided by a blend of from about 50 to 99 weight %, the foregoing copolymer (I) with from about 1 to about 50 weight % of a novel copolymer (II) which has the following structural units:

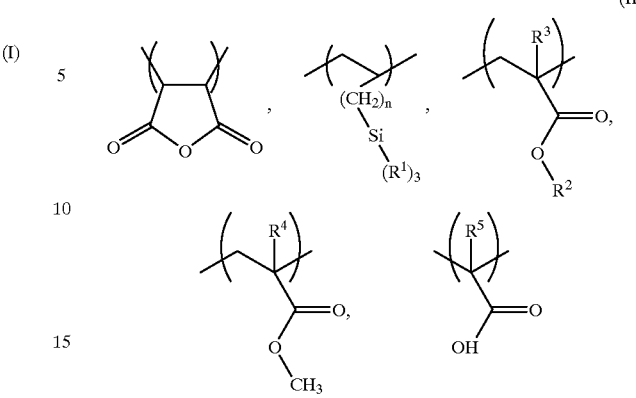

wherein n, $R^1$, $R^2$, $R^3$ and $R^4$ are as defined hereinbefore and $R^5$ is hydrogen or a methyl group.

Copolymer (II) generally comprises from about 25 to about 50 mole % maleic anhydride, about 25 to about 40 mole % alkenetrimethylsilane or alkene (tristrimethylsiloxy) silane, about 1 to about 40 mole % t-butyl methacrylate or acrylate, about 1 to about 25 mole % methyl acrylate or methacrylate, and from about 1 to about 25 mole % acrylic or methacrylic acid. The preferred molecular weight of copolymer (II) is about 10,000 to about 40,000, preferably from about 15,000 to about 25,000.

As with copolymers (I), the level of silicon for copolymers (II) will generally be at a level of from about 6 to about 14% by weight, preferably from about 8 to about 12% by weight.

The novel copolymers (II) are also prepared by free radical polymerization of the maleic anhydride, an alkenetrimethylsilane or alkene(tristrimethylsiloxy)silane, t-butyl acrylate or methacrylate, methyl acrylate or methacrylate and acrylic or methacrylic acid.

Such a photosensitive photoresist composition comprises a blend of two separate copolymers where one copolymer has a low $R_{min}$ (i.e., a $R_{min}$ value of less than 1 Å/sec) while the second copolymer has a higher $R_{min}$ (i.e., a $R_{min}$ of 1 Å/sec or more). The copolymer with the low $R_{min}$ is a copolymer (I) and the copolymer with the higher $R_{min}$ is a copolymer (II). These copolymers are compatible and can be blended together to give the desired dissolution characteristics for a particular photoresist composition. The blend of copolymers can comprise from about 50 to about 99 weight % copolymer (I) and from about 1 to about 50 weight % copolymer (II), preferably from about 80 to about 90 weight percent copolymer (I) and from about 10 to about 20 weight percent copolymer (II), based on the total weight of the two copolymers.

The novel copolymers (I) and (II) of this invention are represented by copolymers (III) which have the following structural units:

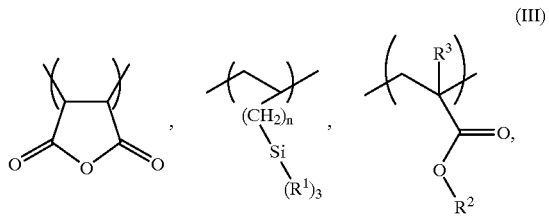

-continued

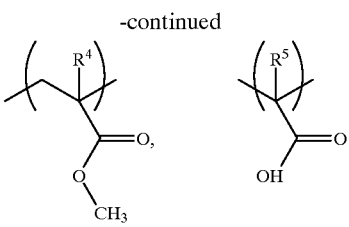

wherein n, $R^1$, $R^7$, $R^3$, $R^4$ and $R^5$ are as defined hereinbefore and the maleic anhydride units comprise from about 25 to about 50 mole %, the alkenetrimethylsilane or alkene (tristrimethylsiloxy)silane units comprise from about 25 to about 50 mole %, the t-butyl acrylate or methacrylate units comprise from about 1 to about 40 mole %, the methyl acrylate or methacrylate units comprise from about 1 to about 25 mole %, and the acrylic or methacrylic acid units comprise from 0 to about 25 mole %. The preferred molecular weight (Mw) of these copolymers (III) will generally be from about 10,000 to about 40,000, preferably from about 15,000 to about 25,000, and the silicone content will be from about 6 to about 14 weight percent, preferably from about 8 to about 12 weight percent.

DETAILED DESCRIPTION OF THE INVENTION AND PREFERRED EMBODIMENTS

In formulating radiation sensitive photoresist compositions suitable for use as photoimageable top layers in deep UV bilayer photolithographic systems, copolymers (I) or blends of copolymers (I) and (II) of this invention are formulated with any suitable photoacid generator in a suitable solvent. The photoresist compositions of this invention will generally contain from about 80 to 99% by weight of the copolymer (I) or blends of copolymers (I) and (II) of this invention, and from about 1 to about 10% by weight photoacid generator. Other additives, such as surfactants, bases pigments, dyes, colorants, filters, antistriation agents, bonding agents, leveling agents, wetting agents and softeners, may also be added to improve lithographic performance. These other additives can comprise from 0 to about 10% by weight of the composition. The photosensitive compositions, after formulation and coating onto a suitable undercoated substrate, can then be imagewise patterned by exposure to actinic radiation from various sources of monochromatic light, such as for example, ArF excimer laser, KrF excimer laser and the like.

Any suitable photoacid generator, particularly nitrobenzyl esters and onium sulfonate salts, which generate acid under the effects of active radiation from exposure sources ranging from election beam, ArF excimer lasers and KrF excimer lasers can be used to form the radiation-sensitive compositions with the copolymers of this invention to prepare the radiation-sensitive photoresist compositions of this invention.

Among the suitable onium sulfonate salts, there may be mentioned particularly aryl sulfonium and iodonium sulfonates, especially triaryl sulfonium and iodonium sulfonates. The aryl groups of the sulfonium or iodonium moieties may be substituted or unsubstituted aryl groups, such as unsubstituted phenyl or naphthyl, or these moieties may be substituted by one or more substituents such as halogen, $C_{1-4}$ alkyl, $C_{1-4}$ alkoxy, —OH and/or nitro substituents. The aryl groups or substituents on each aryl group may be the same or different.

The anion of the photoacid generator may be any suitable anion of a suitable organic sulfonic acid, such as acids of aliphatic, cycloaliphatic, carbocyclic-aromatic, heterocyclic-aromatic or arylaliphatic sulfonic acids. These anions may be substituted or unsubstituted. Partially fluorinated or perfluorinated sulfonic acid derivatives or sulfonic acid derivatives substituted in the neighboring position to the respective acid group are preferred. Examples of substituents are halogens, such as chlorine, and particularly fluorine, alkyl, such as methyl, ethyl or n-propyl, or alkoxy, such as methoxy, ethoxy or n-propoxy and the like.

Preferably the anion is a monovalent anion from a partially fluorinated or perfluorinated sulfonic acid. Preferred are fluorinated alkyl sulfonate anions.

Special examples of suitable onium salts are triphenyl sulfonium bromide, triphenyl sulfonium chloride, triphenyl sulfonium iodide, triphenylsulfonium methane sulfonate, triphenylsulfonium trifluoromethane sulfonate, triphenylsulfonium hexafluoro-propane sulfonate, triphenylsulfonium nonafluorobutane sulfonate, triphenylsulfonium phenyl sulfonate, triphenylsulfonium 4-methylphenyl sulfonate, triphenylsulfonium 4-methoxyphenyl sulfonate, triphenylsulfonium 4-chlorophenyl sulfonate, triphenyl-sulfonium camphorsulfonate, 4-methylphenyl-diphenylsulfonium trifluoromethane sulfonate, bis(4-methylphenyl)-phenylsulfonium trifluoromethane sulfonate, tris-4-methylphenylsulfonium trifluoromethane sulfonate, 4-tert-butylphenyl-diphenylsulfonium trifluoromethane sulfonate, 4-methoxyphenyl-diphenylsulfonium trifluoromethane sulfonate, mesityl-diphenylsulfonium trifluoromethane sulfonate, 4-chlorophenyldiphenyl-sulfonium trifluoromethane sulfonate, bis-(4-chlorophenyl)-phenylsulfonium trifluoro-methane sulfonate, tris-(4-chlorophenyl) sulfonium trifluoromethane sulfonate, 4-methyl-phenyl-diphenylsulfonium hexafluoropropane sulfonate, bis(4-methylphenyl)-phenyl-sulfonium hexafluoropropane sulfonate, tris-4-methylphenylsulfonium hexafluoro-propane sulfonate, 4-tert-butylphenyl-diphenylsulfonium hexafluoropropane sulfonate, 4-methoxyphenyl-diphenylsulfonium hexafluoropropane sulfonate, mesityl-diphenyl-sulfonium hexafluoropropane sulfonate, mesityl-diphenylsulfonium nonafluorooctane sulfonate, mesityl-diphenylsulfonium perfluorobutane sulfonate, 4-chlorophenyl-diphenylsulfonium hexafluoropropane sulfonate, bis-(4-chlorophenyl)-phenylsulfonium hexafluoropropane sulfonate, tris-(4-chlorophenyl) sulfonium hexafluoropropane sulfonate, diphenyliodonium trifluoromethane sulfonate, diphenyliodonium hexafluoropropane sulfonate, diphenyliodonium 4-methylphenyl sulfonate, bis-(4-tert-butylphenyl)iodonium trifluoromethane sulfonate, bis-(4-tert-butyl-phenyl)iodonium hexafluoropropane sulfonate, bis-(4-cyclohexylphenyl)iodonium trifluoromethane sulfonate, tris(4-tert-butylphenyl)sulfonium perfluorooctane sulfonate, and bis-(4-cyclohexylphenyl) iodonium hexafluoropropane sulfonate. Particularly preferred is triphenyl sulfonium trifluoromethane sulfonate (triphenyl sulfonium triflate).

If a base is employed in the photoresist composition, the base may be any suitable base compound, such as oxydianiline, piperonylamine, hexamethyl-triethylenetetramine, 2,4,5-triphenylimidazole, 1,5-diazabicyclo[4,3,0]non-5-ane, or 1,8-diazabicyclo[5,4,0] undec-7-ane, preferably 2,4,5-triphenylimidazole.

Although any suitable solvent may be employed in formulating the photoresist compositions of this invention, the solvent is preferably propylene glycol methyl ether acetate (PGMEA).

Another aspect of this invention is a process for the lithographic treatment of a substrate by means of a multi-layer technique, in which:

the substrate is provided with a first coating of a film-forming aromatic polymer material and then suitably cured, a second coating containing copolymer (I) or a blend of copolymers (I) and (II) of the invention and a substance that forms acid under the effect of actinic radiation of a wavelength of about 193 nm, is introduced on this first coating, the thus-coated substrate is irradiated in an image-forming way with radiation of a wavelength of 248 to 254 or of 193 nm, to which the photoacid generator is sensitive, the irradiated substrate is subjected to a heat treatment, the heat treated irradiated substrate is treated with an aqueous alkaline developer solution, until the irradiated regions of the second coating are removed, and after this, the substrate is treated with an oxygen-containing plasma until the first coating is completely removed on those places where it is not covered by the second coating.

Any suitable film-forming organic polymers can be used as the film-forming organic material for the first coating (undercoat layer) with the use of the multilayer technique, such as phenolic resins, particularly novolak resins, such as formaldehyde cresol or formaldehyde phenol novolaks, polyimide resins, poly(meth)acrylate resins, styrene-allyl alcohol copolymer resins, and preferably copolymers of isobornyl methacrylate and hydroxystyrene thermally cured or crosslined with hexamethoxy melamine as described in of U.S. patent application Ser. No. 09/268,430 filed Mar. 12, 1999. The undercoat layer is generally 0.5 to 1 $\mu$m thick. The undercoat resin is first dissolved in a suitable solvent and then introduced by the usual coating processes onto the substrate, e.g., by dipping, blade coating, painting, spraying, particularly by electrostatic spraying, and reverse-role coating, and above all by spinning, and subsequently cured by methods known in the art.

After the first layer is dried and cured, the second coating, containing copolymer (I) or a blend of copolymers (1) and (II) of this invention, a substance that forms acid under the effect of actinic radiation of a wavelength below 300 nm, preferably below 260 nm, and more preferably at about 193 nm, as well as other additives, if needed, is introduced onto the first coating. The second coating may also be produced with any conventional coating process, for example, one of those named above, but here also spin coating is particularly preferred. The covering layer is appropriately approximately 0.2 to 0.5 $\mu$m thick.

For the production of relief structures, the thus-coated substrate is then selectively exposed, i.e., to form the image. Exposure is preferably produced with actinic radiation of a wavelength of 190–300 nm, particularly of 190 to 260 nm. All known sources of the respective radiation can be utilized in principle for irradiation, for example, mercury high-pressure lamps, but particularly excimer lasers, such as the krypton fluoride (KrF) laser with radiation of 248 nm wavelength or the argon fluoride (ArF) excimer laser with 193 nm radiation. The image-forming irradiation is produced either by means of a mask, preferably a chromium-quartz mask, or--when laser exposure devices are used--also by moving the laser beam in a computer-controlled manner over the surface of the coated substrate and thus the image is produced. Here, the high sensitivity of the photoresist materials of the invention is very advantageously noticeable in that it permits high writing speeds at relatively low intensities. The high sensitivity of the resist is also of advantage for exposure by means of steppers, where very short exposure times are desired.

The process of the invention also encompasses, between selective irradiation and treatment with a developer, a heating of the coating as a further process measure. By means of this heat treatment, the so-called "post-exposure bake", a practically complete reaction of the resist material, is obtained in an especially rapid time. The time and temperature of this post-exposure bake may vary within broad regions and essentially depend on the composition of the resist, particularly by the type of its acid-sensitive photoacid generator used, as well as the concentrations of these two components. Commonly, the exposed resist is subjected to several seconds up to several minutes of temperatures of approximately 50–150° C.

After the image-forming exposure and heat treatment of the material conducted as needed, the irradiation areas of the top coat that are more soluble in aqueous alkaline as a consequence of the irradiation are dissolved out with an aqueous-alkaline developer, i.e., with an aqueous solution of bases to which small quantities of organic solvents or their mixtures may also be added as needed.

Particularly preferred as developers are aqueous alkaline solution, as they are also utilized for the development of conventional novolak naphthoquinone diazide positive resist coatings. These include, e.g., aqueous solutions of alkali metal silicates, phosphates, hydroxides, and carbonates, but particularly tetraalkylammonium hydroxide solutions, such as e.g., tetramethylammonium hydroxide solution, which is free of metal ions. Still smaller quantities of wetting agents and/or organic solvents may also be added to these solutions. Typical organic solvents, which may be added to the developer fluids, are, for example, 2-ethoxyethanol, isopropanol or ethanol, as well as mixtures of two or more of these solvents.

After this, the thus-treated workpiece is treated with an oxygen or oxygen-containing plasma, whereby a closed silicon oxide layer is formed within several seconds, at least in the uppermost regions of the top coating of organosilicon components in the covering layer, and this silicon oxide layer protects the regions of the organic material lying underneath against an attack of oxygen plasma. Treatment with the oxygen plasma is continued until the substrate is completely free in those places where the top coating has been removed beforehand by means of the developer. In general, an etching time of 1 to 15 minutes is sufficient for this purpose.

The substrate can finally be subjected to a conventional structuring treatment, e.g., a dry etching in halogen or fluorocarbon plasmas on those places free of the coating. After this, the entire protective coating is removed from the substrate, e.g., by dissolving with a suitable stripper or by $O_2$ plasma ashing, after which the depicted process cycle is repeated, if needed, in order to produce further structures on the substrate. Therefore, a process for the production of an object, particularly an electronic component, comprising the above-depicted process for the lithographic treatment of a substrate forms another embodiment of the invention.

The present invention is further illustrated by the following Examples. All parts and percentages are by weight and all temperatures are degrees Celsius unless explicitly stated otherwise.

EXAMPLES OF SYNTHETIC PROCEDURES

Example 1

Synthesis of Poly(maleic anhydride-allyltrimethylsilane-t-butyl acrylate-methyl Acrylate)

In a 250 ml, round bottom flask equipped with a reflux condenser and a gas inlet was combined maleic anhydride (8.85 g, 0.090 mol) and tetrahydrofuran (30 ml). The mixture was stirred under a $N_2$ atmosphere until all the maleic anhydride was dissolved. To this solution was added allyltrimethylsilane (10.29 g, 0.090 mol), t-butyl acrylate (8.76 g, 0.068 mol), methyl acrylate (2.10 g, 0.024 mol) and 2,2'-azobisisobutyronitrile (0.148 g, 0.9 mmol). The mixture was heated to 64° C., and the mixture was stirred at this temperature for 18 h. The reaction mixture was cooled to room temperature and added dropwise to hexanes (500 ml). The precipitate was filtered, and the solid was dried in vacuo (12 mm Hg) at room temperature for 1 h. The solid was dissolved in tetrahydrofuran (50 ml), and the solution was added dropwise to hexanes (500 ml). The precipitate was filtered, and the solid was dried in vacuo (0.2 mm Hg) 50° C. for 16 h giving poly(maleic anhydride-allyltrimethylsilane-t-butyl acrylate-methyl acrylate) (22.6 g, 75.3%) as a white powder. $^1$H NMR ($d_6$-acetone, 250 MHz): 30.0 mol % maleic anhydride, 30.0 mol % allyltrimethylsilane, 25.4 mol % t-butyl acrylate, 14.8 mol % methyl acrylate. GPC (Waters Corp. liquid chromatograph [refractive index detection, Millenium GPC V software, Phenogel-10, 7.8×250 mm column: 10-4A, 500A&50A, THF eluent]): $M_w$=14, 921; Polydispersity=2.51; $R_{min}$= about 0.1 Å/sec.

Example 2

Synthesis of Poly(maleic anhydride-allyltrimethylsilane-t-butyl acrylate-methyl-acrylate-acrylic Acid)

In a 250 ml, round bottom flask equipped with a reflux condenser and a gas inlet was combined maleic anhydride (8.76 g, 0.089 mol) and tetrahydrofuran (30 ml). The mixture was stirred under a $N_2$ atmosphere until all the maleic anhydride was dissolved. To this solution was added allyltrimethylsilane (10.23 g, 0.089 mol), t-butyl acrylate (8.82 g, 0.069 mol), methyl acrylate (1.20 g, 0.014 mol), acrylic acid (1.0 g, 0.014 mol) and 2,2'-azobisisobutyronitrile (0.146 g, 0.9 mmol). The mixture was heated to 64° C., and the mixture was stirred at this temperature for 18 h. The reaction mixture was cooled to room temperature and added dropwise to hexanes (500 ml). The precipitate was filtered, and the solid was dried in vacuo (12 mm Hg) at room temperature for 1 h. The solid was dissolved in tetrahydrofuran (50 ml), and the solution was added dropwise to hexanes (500 ml). The precipitate was filtered, and the solid was dried in vacuo (0.2 mm Hg) 50° C. for 16 h giving poly(maleic anhydride-allyltrimethylsilane-t-butyl acrylate-methyl acrylate-acrylic acid) (23.9 g, 79.7%) as a white powder. $^1$H NMR (d6-acetone, 250 MHz): 30.0 mole % maleic anhydride, 30.0 mole % allyltrimethylsilane, 25.4 mole % t-butyl acrylate, 14.8 mol % methyl acrylate. GPC V software, Phenogel-10, 7.8×250 mm column: 10-4A, 500A & 50A, THF eluent]): $M_w$=14, 921; Polydispersity=2.51; $R_{min}$=2.5 Å/sec.

Example 3

Formulation of Poly(maleic anhydride-allyltrimethylsilane-t-butyl acrylate-methyl Acrylate)

For 35 g of imaging layer solution (total 9 weight % solids), 2.98 g of poly(maleic anhydride-allyltrimethylsilane-t-butyl acrylate-methyl acrylate) of Example 1, 0.158 g of a triarylsulfonium perfluorooctan sulfonate photoacid generator, and 0.01 g of 2,4,5-triphenylimidazole were combined and dissolved in 31.85 g of propylene glycol methyl ether acetate (PGMEA). The mixture was rolled until the components dissolved, and the imaging layer solution was filtered twice through a 0.1 μm Teflon filter.

Example 4

Formulation of 90:10 Weight Percent Blended Poly (maleic anhydride-allyltrimethylsilane-t-butyl acrylate-methyl acrylate) and Poly(maleic anhydride-allyltrimethylsilane-t-butyl acrylate-methyl acrylate-acrylic Acid)

For 35 g of imaging layer solution (total 9 weight % solids), 2.68 g of poly(maleic anhydride-allyltrimethylsilane-t-butyl acrylate-methyl acrylate of Example 1, 0.299 g of poly(maleic anhydride-allyltrimethylsilane-t-butyl acrylate-methyl acrylate-acrylic acid) of Example 2, 0.158 g of a triarylsulfonium perfluorooctan sulfonate photoacid generator, and 0.01 g of 2,4,5-triphenylimidazole were combined and dissolved in 31.85 g of propylene glycol methyl ether acetate (PGMEA). The mixture was rolled until the components dissolved, and the imaging layer solution was filtered twice through a 0.1 μm Teflon filter.

Example 5

Formulation of 80:20 Weight Percent Blended Poly (maleic anhydride-allyltrimethylsilane-t-butyl acrylate-methyl acrylate) and Poly(maleic anhydride-allyltrimethylsilane-t-butyl acrylate-methyl acrylate-acrylic Acid)

For 35 g of imaging layer solution (total 9 weight % solids), 2.39 g of poly(maleic anhydride-allyltrimethylsilane-t-butyl acrylate-methyl acrylate of Example 1, 0.596 g of poly(maleic anhydride-allyltrimethylsilane-t-butyl acrylate-methyl acrylate-acrylic acid) of Example 2, 0.158 g of a triarylsulfonium perfluorooctan sulfonate photoacid generator, and 0.01 g of 2,4,5-triphenylimidazole were combined and dissolved in 31.85 g of propylene glycol methyl ether acetate (PGMEA). The mixture was rolled until the components dissolved, and the imaging layer solution was filtered twice through a 0.1 μm Teflon filter.

Preparation of Bilayer Resist Films

Silicon wafers were spin coated with a thermally curable undercoat and post apply baked at 207° C. for 70 sec giving a 5000 Å film thickness. The undercoat was a hexamethoxymelamine thermally cured copolymer of isobornyl methacrylate and hydroxystyrene. The above imaging layer formulations of Examples 3, 4 and 5 were spin coated over the undercoat and post apply baked at 115° C. for 60 sec giving a 2500 Å film thickness. The coated wafers were then exposed using an ISI 9300 Microstepper. The wafers were post exposure baked at 115° C. for 60 sec and developed for 60 seconds in 0.262 N-tetramethyl ammonium hydroxide. The wafers were spun dry and the images were analyzed by scanning electron microscope. Each of the imaging layers was able to resolve 0.12 μm dense features at a 1:1 pitch.

With the foregoing description of the invention, those skilled in the art will appreciate that modifications may be made to the invention without departing from the spirit thereof. Therefore, it is not intended that the scope of the invention be limited to the specific embodiments illustrated and described.

We claim:

1. A radiation-sensitive copolymer comprising structural units of the formulae:

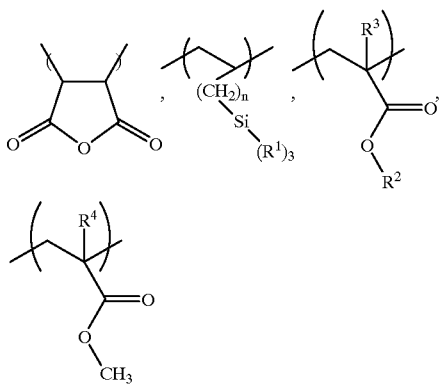

and optionally

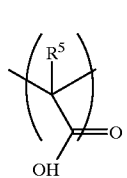

(III)

wherein n is an integer of 1 to 5, $R^1$ is methyl or trimethylsiloxy, $R^2$ is a tert-butyl group, $R^3$, $R^4$ and $R^5$ are each independently hydrogen or a methyl group.

2. A radiation-sensitive copolymer of claim 1 wherein n is 1, $R^1$ is methyl and $R^3$, $R^4$ and $R^5$ are each hydrogen.

3. A radiation-sensitive copolymer of claim 1 wherein the copolymer comprises from about 25 to about 50 mole % maleic anhydride units, about 25 to about 40 mole % alkenetrimethylsilane or alkene(tristrimethylsiloxy)silane units, about 1 to about 40 mole % t-butyl acrylate or methacrylate units, from about 1 to about 25 mole % methyl acrylate or methacrylate, 0 mole % acrylic or methacrylic acid, and has a $R_{min}$ in tetramethylammonium hydroxide of less than 1 Å/sec.

4. A radiation-sensitive copolymer of claim 3 wherein the copolymer has a molecular weight (Mw) of from about 10,000 to about 40,000 and a silicon content of from about 8 to about 12% by weight.

5. A radiation-sensitive copolymer of claim 1 wherein the copolymer comprises from about 25 to about 50 mole % maleic anhydride units, about 25 to about 40 mole % alkenetrimethylsilane or alkene(tristrimethylsiloxy)silane units, about 1 to about 40 mole % t-butyl acrylate or methacrylate units, from about 1 to about 25 mole % methyl acrylate or methacrylate, about 1 to about 25 mole % acrylic or methacrylic acid, and has a $R_{min}$ in tetramethylammonium hydrode is 1 Å/sec or more.

6. A radiation-sensitive copolymer of claim 5 wherein the copolymer has a molecular weight (Mw) of from about 10,000 to about 40,000 and a silicon content of from about 8 to about 12% by weight.

7. A radiation-sensitive copolymer of claim 1 wherein the copolymer has a molecular weight (Mw) of from about 10,000 to about 40,000 and a silicon content of about 8 to about 12% by weight.

8. A blend of copolymers of claim 1 comprising a blend of:

(a) a first copolymer comprising from about 25 to about 50 mole % maleic anhydride units, about 25 to about 40 mole % alkenetrimethylsilane or alkene(tristrimethylsiloxy)silane units, about 1 to about 40 mole % t-butyl acrylate or methacrylate units, from about 1 to about 25 mole % methyl acrylate or methacrylate, 0 mole % acrylic or methacrylic acid, and has a $R_{min}$ in tetramethylammonium hydroxide of less than 1 Å/sec, and (b) a second copolymer comprising from about 25 to about 50 mole % maleic anhydride units, about 25 to about 40 mole % alkenetrimethylsilane or alkene(tristrimethylsiloxy)silane units, about 1 to about 40 mole % t-butyl acrylate or methacrylate units, from about 1 to about 25 mole % methyl acrylate or methacrylate, about 1 to about 25 mole % acrylic or methacrylic acid, and has a $R_{min}$ in tetramethylammonium hydroxide of 1 Å/sec or more, and wherein the first copolymer comprises from about 50 to about 99 weight percent of the blend and the second copolymer comprises from about 1 to about 50 weight percent of the blend.

9. A blend of copolymers according to claim 8 wherein the molecular weight (Mw) of each of the polymers is the range of from about 10,000 to about 40,000 and the silicon content is from about 8 to about 12% by weight.

10. A blend of copolymers according to claim 9 wherein the first copolymer comprises from about 80 to about 90 weight percent and the second copolymer comprises from about 10 to about 20 weight percent of the blend of copolymers.

11. A radiation-sensitive photoresist composition comprising:

a first copolymer comprising structural units of the formulae:

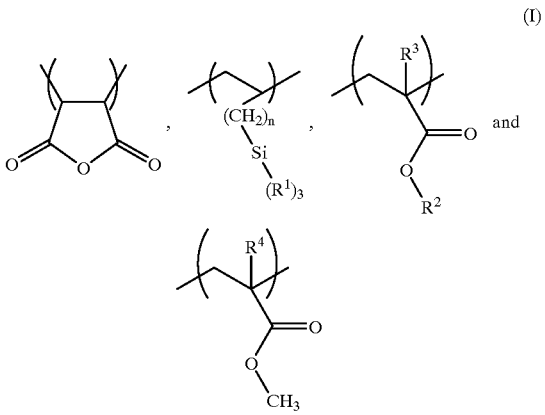

(I)

wherein n is an integer of 1 to 5, $R^1$ is methyl or trimethylsiloxy, $R^2$ is a tert-butyl group, and $R^3$ and $R^4$ are each independently hydrogen or methyl groups;

a photosensitive compound which generates an acid upon exposure to actinic radiation; and a solvent capable of dissolving the copolymer and the photosensitive acid generating compound.

12. A radiation-sensitive photoresist composition according to claim 11 additionally comprising a second copolymer comprising structural units of the formulae:

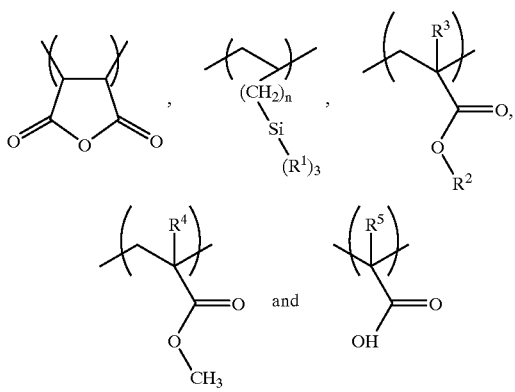

(II)

wherein n is an integer of 1 to 5, $R^1$ is methyl or trimethylsiloxy, $R^2$ is t-butyl and $R^3$, $R^4$ and $R^5$ are each independently hydrogen or a methyl group.

13. A radiation-sensitive photoresist composition according to claim 12 wherein the second copolymer comprises from about 25 to about 50 mole % maleic anhydride units, about 25 to about 40 mole % alkenetrimethylsilane or alkene(tristrimethylsiloxy)silane units, about 1 to about 40 mole % t-butyl acrylate or methacrylate units, from about 1 to about 25 mole % methyl acrylate or methacrylate, about 1 to about 25 mole % acrylic or methacrylic acid, and has a $R_{min}$ in tetramethylammonium hydrode is 1 Å/sec or more.

14. A radiation-sensitive photoresist composition according to claim 13 wherein each of the copolymers has a molecular weight (Mw) of from about 10,000 to about 40,000 and a silicon content of from about 8 to about 12% by weight and the first copolymer comprises about 50 to about 99 weight % and the second copolymer comprises about 1 to 50 wt % based on the total weight of the two copolymers.

15. A radiation-sensitive photoresist composition according to claim 11 wherein the copolymer comprises from about 25 to about 50 mole % maleic anhydride units, about 25 to about 40 mole % alkenetrimethylsilane or alkene (tristrimethyl-siloxy)silane units, about 1 to about 40 mole % t-butyl acrylate or methacrylate units, from about 1 to about 25 mole % methyl acrylate or methacrylate, and has a $R_{min}$ in tetramethylammonium hydroxide of less than 1 Å/sec.

16. A process for forming a pattern on a substrate which comprises:

(a) coating a photoresist coating of the radiation-sensitive photoresist composition of claim 11 over a planarizing undercoat on a wafer substrate;

(b) exposing portions of the photoresist coating to actinic radiation; and (c) developing the photoresist coating with a developer solution to provide a patterned substrate.

17. The process according to claim 16 wherein the actinic radiation has a wavelength of about 193 nm.

18. The process according to claim 17 wherein the planarizing undercoat on the wafer substrate is a coating of a melamine cured copolymer of isobornyl methacrylate and hydroxystyrene.

19. A process for forming a pattern on a substrate which comprises:

(a) coating a photoresist coating of the radiation-sensitive photoresist composition of claim 12 over a planarizing undercoat on a wafer substrate;

(b) exposing portions of the photoresist coating to actinic radiation; and (c) developing the photoresist coating with a developer solution to provide a patterned substrate.

20. The process according to claim 19 wherein the actinic radiation has a wavelength of about 193 nm.

21. The process according to claim 20 wherein the planarizing undercoat on the wafer substrate is a coating of a melamine cured copolymer of isobornyl methacrylate and hydroxystyrene.

22. A patterned substrate produced according to the process of claim 16.

23. A process for the lithographic treatment of a substrate comprising:

(a) providing an undercoat of a film-forming aromatic polymer on the substrate;

(b) providing over the undercoat a second coating containing at least one copolymer according to claim 1 and a photoacid generating compound that generates acid under the effect of actinic radiation of a wavelength of about 193 nm;

(c) irradiating the thus coated substrate of step (b) in an image-forming manner with radiation of a wavelength of about 193 nm;

(d) subjecting the irradiated substrate to heat;

(e) treating the irradiated substrate with an aqueous-alkaline developer solution until the irradiated regions of the second coating are removed; and (f) treating the coated substrate of step (e) with an oxygen-containing plasma until the undercoat is completely removed on those places where it is not covered by the second coating.

24. A patterned substrate produced according to the process of claim 23.

* * * * *